United States Patent
Pyoun (10) Patent No.: US 9,535,549 B2
(45) Date of Patent: Jan. 3, 2017

(54) TOUCH INPUT DEVICE

(71) Applicant: SAMSUNG DISPLAY CO., LTD., Yongin, Gyeonggi-Do (KR)

(72) Inventor: Joong-Bae Pyoun, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/474,766

(22) Filed: Sep. 2, 2014

(65) Prior Publication Data

US 2015/0062082 A1    Mar. 5, 2015

(30) Foreign Application Priority Data

Sep. 3, 2013 (KR) ........................ 10-2013-0105324

(51) Int. Cl.
| | |
|---|---|
| G06F 3/045 | (2006.01) |
| G06F 3/044 | (2006.01) |
| G01R 31/00 | (2006.01) |
| G06F 3/0354 | (2013.01) |

(52) U.S. Cl.
CPC .............. *G06F 3/044* (2013.01); *G01R 31/00* (2013.01); *G06F 3/03545* (2013.01); *G06F 2203/04103* (2013.01)

(58) Field of Classification Search
USPC ......................... 345/158, 163, 173, 174, 179
See application file for complete search history.

(56) References Cited

U.S. PATENT DOCUMENTS

| | | | | |
|---|---|---|---|---|
| 8,675,147 B2* | 3/2014 | Murakami | ............. | G06F 3/045 345/173 |
| 8,988,398 B2* | 3/2015 | Cao | ...................... | G06F 3/0383 345/158 |
| 2009/0284495 A1* | 11/2009 | Geaghan | ............... | G06F 3/0416 345/174 |
| 2010/0245246 A1* | 9/2010 | Rosenfeld | ........... | G06F 3/03543 345/163 |
| 2012/0113039 A1* | 5/2012 | Nghiem | ................ | G06F 3/0202 345/173 |
| 2013/0127793 A1* | 5/2013 | Jung | .................... | G06F 3/03545 345/179 |
| 2013/0194242 A1* | 8/2013 | Park | .................... | G06F 3/03545 345/179 |
| 2014/0139465 A1* | 5/2014 | Grosberg | ............ | G06F 3/04886 345/173 |
| 2014/0300586 A1* | 10/2014 | Dowd | ................. | G06F 3/03545 345/179 |

FOREIGN PATENT DOCUMENTS

| | | |
|---|---|---|
| KR | 10-2010-0115522 A | 10/2010 |
| KR | 10-2011-0122528 A | 11/2011 |
| KR | 10-1131771 B1 | 3/2012 |
| KR | 10-2013-0008805 A | 1/2013 |
| KR | 20-2013-0002268 | 4/2013 |

* cited by examiner

*Primary Examiner* — Thuy Pardo
(74) *Attorney, Agent, or Firm* — Lee & Morse, P.C.

(57) ABSTRACT

A touch input device including a body having an open end at an open end portion of the body, a mesh-shaped guide member at the open end portion, a conductor bundle, and a driving unit. The mesh-shaped guide member may have a plurality of openings. The conductor bundle may include a plurality of conductive touch pins vertically drivable through the plurality of openings. The driving unit may vertically drive the conductor bundle.

12 Claims, 7 Drawing Sheets

TOUCH INPUT DEVICE

CROSS-REFERENCE TO RELATED APPLICATION

Korean Patent Application No. 10-2013-0105324, filed on Sep. 3, 2013, in the Korean Intellectual Property Office, and entitled: "Touch Input Device," is incorporated by reference herein in its entirety.

BACKGROUND

1. Field

Embodiments relate to a touch input device.

2. Description of the Related Art

A touch screen panel is a device that allows a user's instruction to be input by selecting an instruction content displayed on a screen of an image display device or the like with a user's hand or an object such as a stylus pen. When characteristics of the touch screen panel are tested, a touch input device in place of a user's hand may be used to provide an exact touch input to the touch screen panel. For example, when characteristics of a capacitive touch screen panel are tested, a conductive rod may be used, which causes a change in capacitance when being contacted with the touch screen panel.

SUMMARY

A touch input device is provides that includes a body having an open end at an open end portion of the body, a mesh-shaped guide member at the open end portion, a conductor bundle, and a driving unit. The mesh-shaped guide member has a plurality of openings. The conductor bundle includes a plurality of conductive touch pins vertically drivable through the plurality of openings. The driving unit vertically drives the conductor bundle. The plurality of conductive touch pins may be independently vertically drivable through different openings of the guide member. The guide member may have a mesh-shaped plane. The guide member may include a plurality of tubes that guide the vertical driving of each conductive touch pin.

The driving unit may include an elastic member accommodated inside the body couplable to the plurality of conductive touch pins, and a control device that controls the pressure inside the elastic member. The control device may include a hydraulic oil pump. The driving unit may include a plurality of piston structures accommodated inside the body so that each piston structure may be coupled to at least one of the conductive touch pins, and a control device that controls the vertical driving of each piston structure.

The conductive touch pin may include a first end coupled to each piston structure and a second end passable in and out through the guide member. The second end may have a sectional area wider than that of the one end. The control device may include a hydraulic oil pump. The touch input device may further include a diaphragm provided at the open end portion of the body that adjusts an opened area of the body, and a diaphragm control unit that controls the diaphragm. The guide member may include a conductive material electrically coupled to a ground portion.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. When a first element is described as being coupled to a second element, the first element may be not only directly coupled to the second element but may also be indirectly coupled to the second element via a third element. Like reference numerals refer to like elements throughout.

Figure 1:
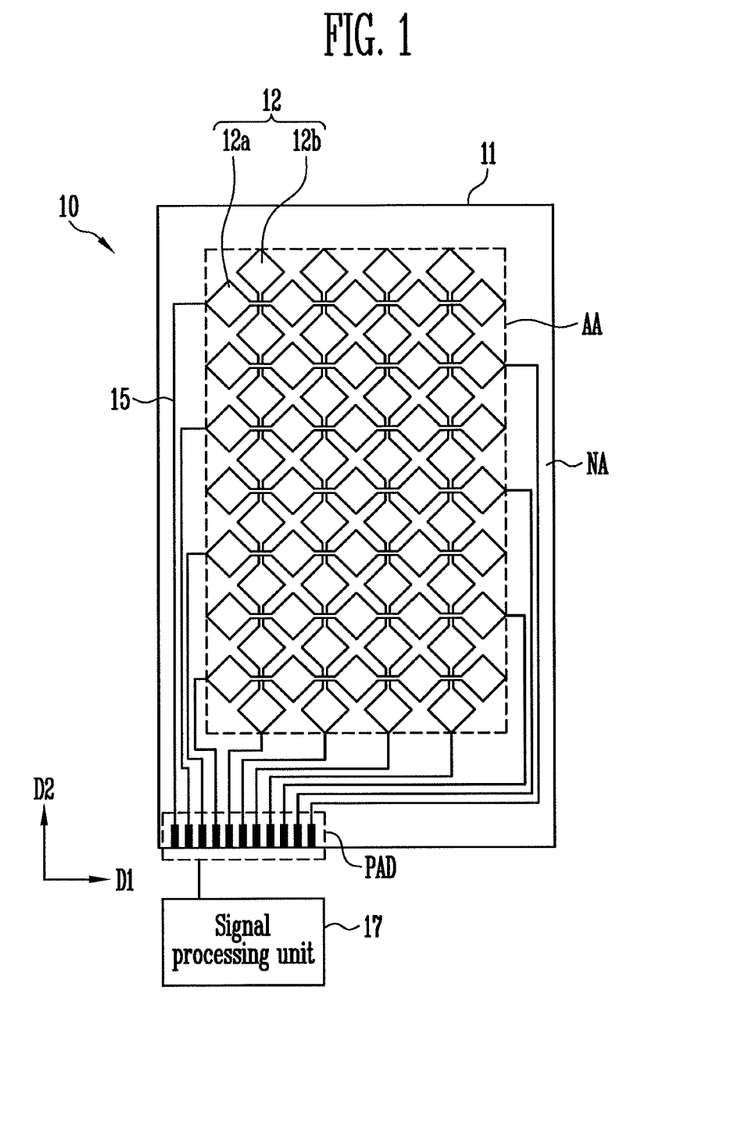
FIG. 1 illustrates a plan view of a schematic of a touch screen panel.
Figure 2A:
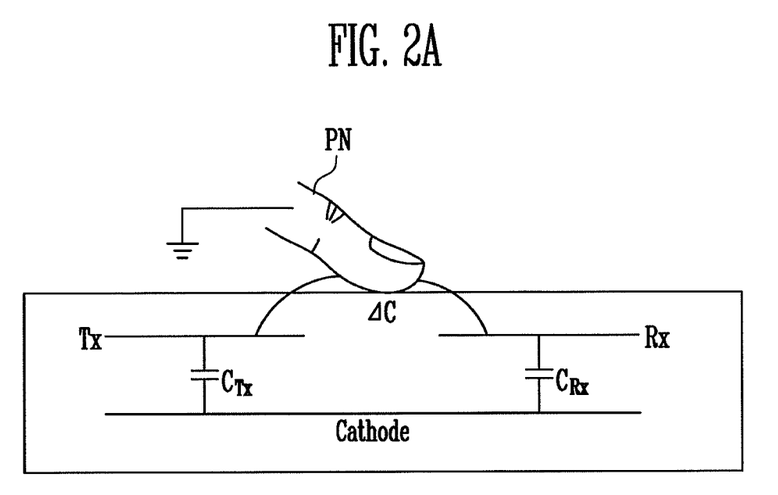
FIGS. 2A and 2B illustrate conceptual views of a touch input principle.
Figure 2B:
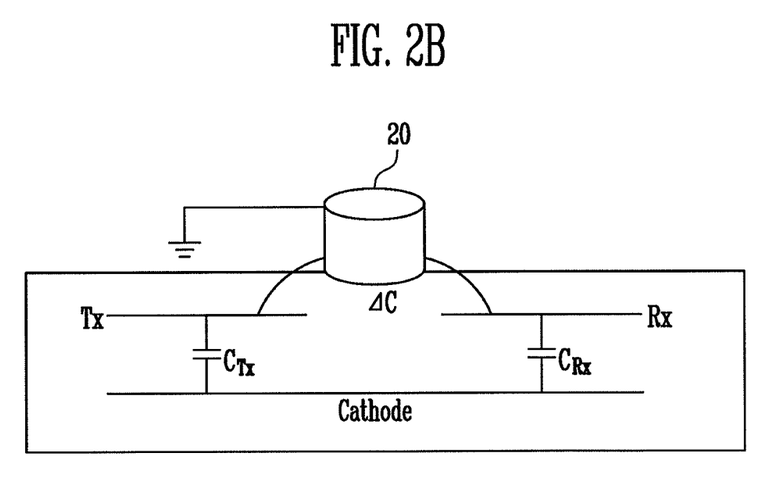

FIG. 1 schematically illustrates a plan view of a touch screen panel. FIGS. 2A and 2B illustrate conceptual views of a touch input principle. First, referring to FIG. 1, the touch screen panel 10 may include a substrate 11 divided into an active area AA and a non-active area NA, sensing electrodes 12 in the active area AA of the substrate 11, outer lines 15 in the non-active area NA of the substrate 11, and a signal processing unit 17 electrically coupled to the sensing electrodes 12 to process a sensing signal.

The substrate 11 may be divided into the active area AA overlapped with an image display area and in which the sensing electrodes 12 for sensing a touch input may be located, and the non-active area NA positioned at the outside of the active area AA and in which the outer lines 15 may be located. The substrate 11 may be implemented as a rigid substrate such as a glass substrate, a film substrate having flexibility, or the like. For example, the substrate 11 may include a material having high thermal resistance and chemical resistance characteristics while having transparent and flexible characteristics. The substrate 11 may include, for example, one or more materials selected from polyethyleneterephthalate (PET), polycarbonate (PC), acryl, polymethylmethacrylate (PMMA), triacetylcellulose (TAC), polyethersulfone (PES) and polyimide (PI).

The sensing electrodes 12 may be distributed in the active area AA on the substrate 11. The sensing electrodes 12 may include first sensing electrodes 12a and second sensing electrodes 12b, which are electrically coupled along different directions from each other. The first sensing electrodes 12a may be coupled along a first direction D1. The second sensing electrodes 12b may be disposed between the first sensing electrodes 12a. The second sensing electrodes 12a may be coupled along a second direction D2 intersecting the first direction D1. The first sensing electrodes 12a and the second sensing electrodes 12b may be alternately positioned along different directions from each other. For example, the first sensing electrodes 12a may be coupled along a row direction (horizontal direction) to be coupled to the outer lines 15 for each row line. The second sensing electrodes 12*b* may be coupled along a column direction (vertical direction) to be coupled to the outer lines 15 for each column line. The sensing electrodes 12 may include a transparent electrode material such as ITO, so that light can be transmitted therethrough. The sensing electrodes 12 may be formed by depositing a conductive material on the substrate 11 and then patterning the deposited conductive material, for example, using a photoresist method.

An electrostatic capacitive method, a resistive overlay method, a surface acoustic wave method, an infrared beam method, and the like may be applied as touch sensing methods. In the electrostatic capacitive method, when a user's hand or object is contacted, for example, the contact position is converted into an electrical signal by sensing a change in capacitance formed between a conductive sensing electrode and an adjacent sensing electrode or ground electrode. The first and second sensing electrodes 12*a* and 12*b* may, for example, include the same material, and may be disposed in a diamond pattern in the same layer on any one surface of the substrate 11. They may also or alternatively include different materials. An insulating layer for ensuring electrical stability, i.e. insulation properties between the first and second sensing electrodes 12*a* and 12*b* may be provided, for example, at intersection portions between the first sensing electrodes 12*a* and the second sensing electrodes 12*b*. The material, shape and arrangement of the sensing electrodes 12 may be variously modified and embodied.

The first and second sensing electrodes 12*a* and 12*b* may be positioned in a straight stripe pattern in different layers. The sensing electrodes 12 may have a metal mesh pattern implemented with fine metal lines other than a transparent conductive material. The first and second sensing electrodes 12*a* and 12*b* may be respectively located on both surfaces of the substrate 11 with the substrate 11 interposed therebetween.

The outer lines 15 may be provided so that the first sensing electrodes 12*a* for each line along the first direction D1 and the second sensing electrodes 12*b* for each line along the second direction D2 may be coupled to an external driving circuit therethrough. For example, the outer lines 15 may be electrically coupled to the respective row and column lines of the first and second sensing electrodes 12*a* and 12*b*, so that the first and second sensing electrodes 12 and 12*b* may be coupled to the external driving circuit such as the signal processing unit 17 through a pad portion PAD. The outer lines 15 may be disposed in the non-active area NA as an edge portion of the touch screen panel while avoiding the active area AA overlapped with the image display area. The material of the outer lines 15 may be selected from a wide range of suitable materials, and the outer lines 15 may include not only a transparent electrode material used to form the sensing electrodes 12, but also a low-resistance metallic material such as molybdenum (Mo), silver (Ag), titanium (Ti), copper (Cu), aluminum (Al), or Mo/Al/Mo.

When a touch input is applied to the touch screen panel 10, for example, the signal processing unit 17 may sense the touch input by checking a change in capacitance generated by the sensing electrodes 12, and may detect a position at which the touch input may be applied. The touch screen panel 10 of this embodiment is an electrostatic capacitive touch screen panel. For example, the first sensing electrodes 12*a* may be set as Tx electrodes that may transmit a sensing signal, and the second sensing electrodes 12*b* may be set as Rx electrodes that may receive the sensing signal.

Referring to FIGS. 2A and 2B, capacitance may in each of the Tx and Rx electrodes. For example, each of the Tx and Rx electrodes may form capacitance with an electrode layer, for example, a cathode electrode layer, provided in a lower display panel. Capacitance may also be formed between adjacent Tx and Rx electrodes, which may designated as $C_{Tx}$ and $C_{Rx}$, respectively. A difference between such capacitances or a change in capacitance may be designated as $\Delta C$. If a contact object such as a user's finger PN or a separate touch input device 20 is contacted with the touch screen panel 10, the capacitance formed between the Tx and Rx electrodes may be changed. The touch input device 20 may be implemented as, for example, a conductive rod. If the contact object is contacted with the touch screen panel 10, the capacitance formed between the Tx and Rx electrodes may be changed, and the change in the capacitance may be transferred as an electrical signal to the signal processing unit 17, to be used in detecting a touch input.

When, for example, a characteristic of the touch screen panel 10, i.e., a touch function is tested and estimated, the touch input device 20 in place of a user's hand may be used to perform an exact touch input. For example, when the characteristic of the touch screen panel may be tested, the touch input device 20 in the shape of a cylindrical conductive rod may be used. The conductive rod may have a diameter of from about 3 mm to about 6 mm, and may include a metal. If the touch input device 20 is contacted with a surface of the touch screen panel 10, for example, a touch input may be sensed with the same principle as the touch screen panel 10 may be touched with a user's finger.

When, for example, the touch input device 20 is implemented with the cylindrical conductive rod, a stable touch input can be provided when the characteristic of a flat touch screen panel is tested. When the touch input device 20 is contacted with a curved surface area of a flexible touch screen panel or a touch screen panel having a curved surface, for example, a touch input might not be sensed or may be unstably provided. Similarly, when a window is implemented to be integrated with the touch screen panel, for example, when a window provided on the touch screen panel is implemented to have flexibility or when a window is implemented to have a curved surface, a touch input might not be sensed or may be unstably provided. When touch input device 20 is contacted with a curved surface area of the flexible touch screen panel or the touch screen panel having the curved surface, for example, the contact area between the conductive rod and the touch screen panel may be decreased in the curved surface area.

Figure 3:
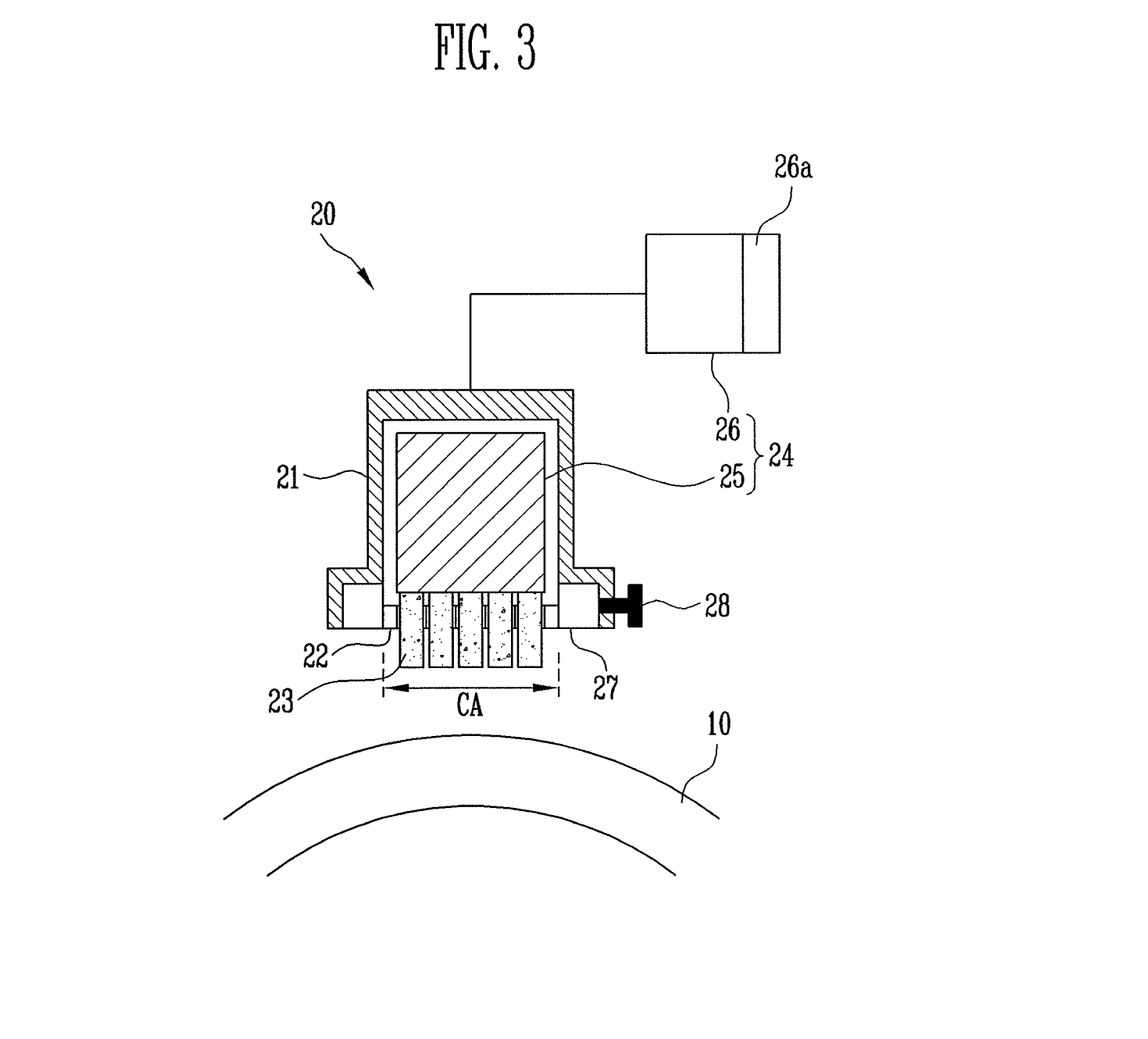
FIG. 3 illustrates a configuration view of a schematic of a touch input device.
Figure 4:
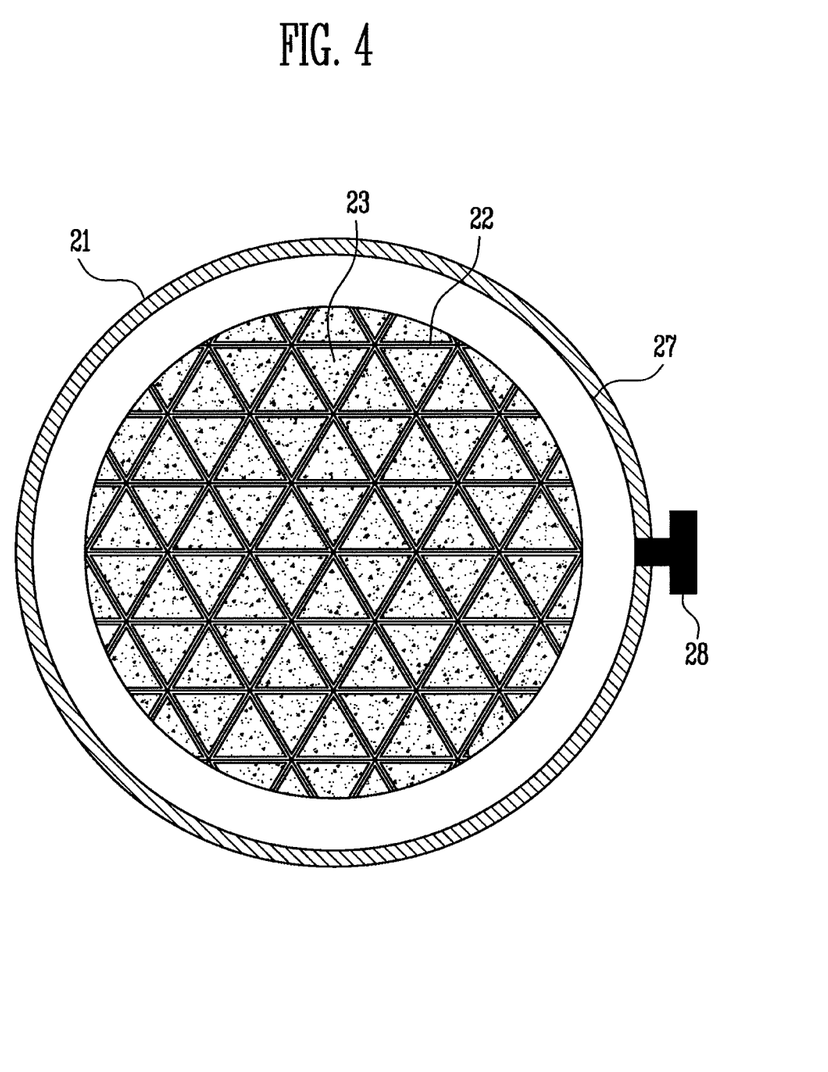
FIG. 4 illustrates a plan view of an end portion of the touch input device shown in FIG. 3.
Figure 5:
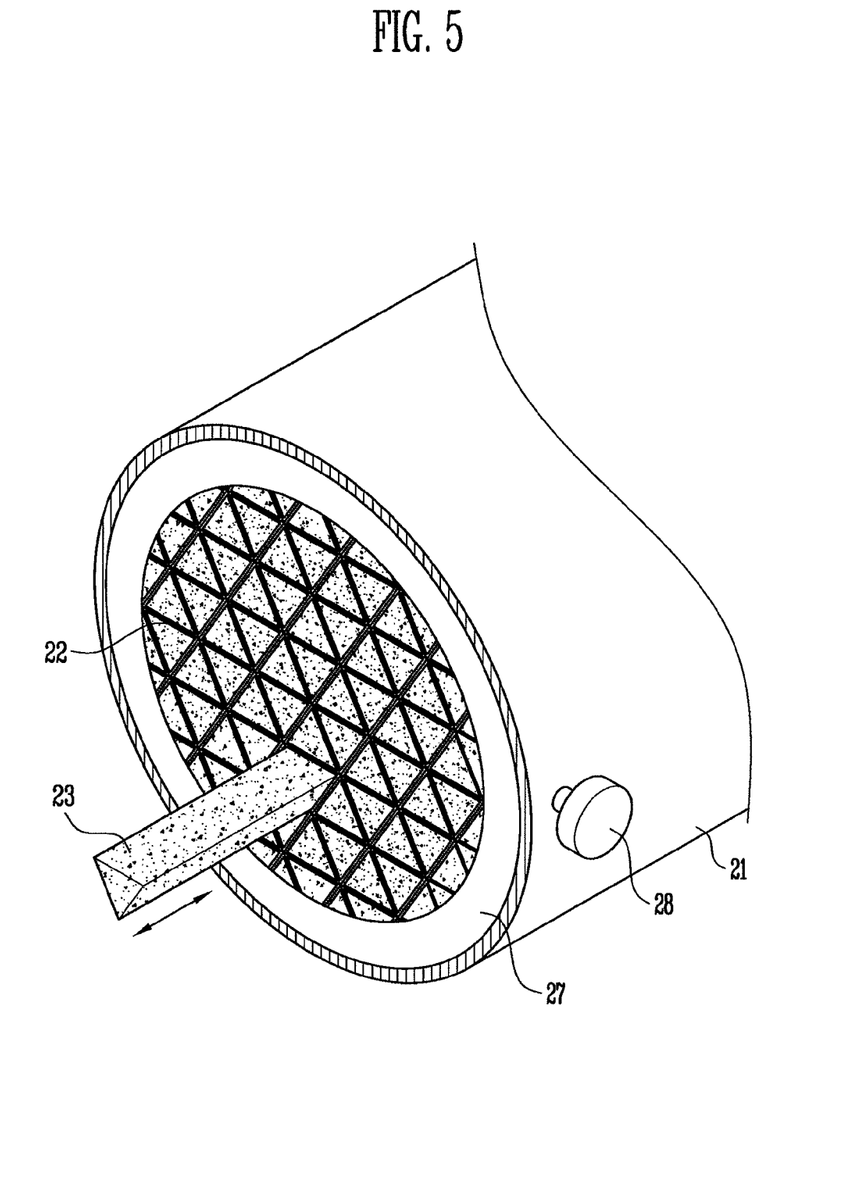
FIG. 5 illustrates a perspective view exemplarily of the end portion of the touch input device shown in FIG. 3.
Figure 6:
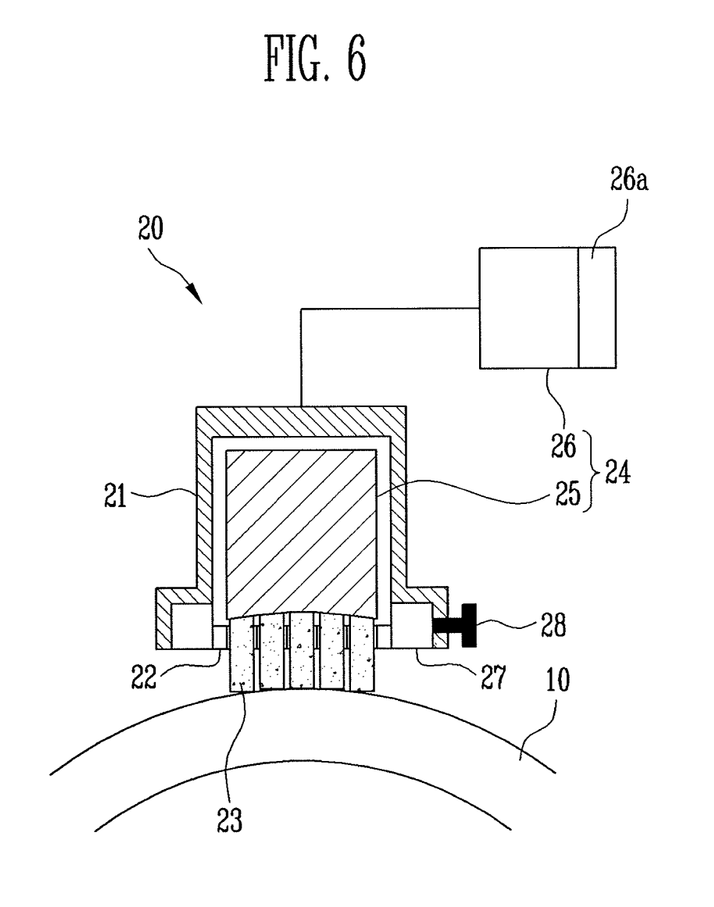
FIG. 6 illustrates schematically a view of a state in which the touch input device shown in FIG. 3 is contacted with a touch screen panel.

A touch input device is described herein through which a stable touch input is possible with respect to a touch screen panel having a curved surface. A specific embodiment of the touch input device is described with reference to FIGS. 3 to 7. FIG. 3 schematically illustrates a configuration view of a touch input device. FIG. 4 illustrates a plan view exemplarily of an end portion of the touch input device shown in FIG. 3. FIG. 5 illustrates a perspective view of the end portion of the touch input device shown in FIG. 3. FIG. 6 schematically illustrates a view of a state in which the touch input device shown in FIG. 3 is contacted with a touch screen panel.

Referring to FIG. 3, the touch input device 20 may include a body 21, a guide member 22 provided at one end portion of the body 21, a conductor bundle including a plurality of conductive touch pins 23 configured to pass through respective openings of the guide member 22, and a driving unit 24 configured to vertically drive the conductor bundle. The touch input device 20 may further include a diaphragm 27 at one opened end portion of the body 21, through which the conductive touch pins 23 may enter and/or exit, and a diaphragm control unit 28. The touch input device 20 can provide a stable touch input to even a flexible or curved touch screen panel 10 (or a flexible or curved window configured to be integrated with the touch screen panel or provided on the touch screen panel). The body 21 may have one end portion opened in a contact area CA. The plurality of conductive touch pins 23 may be vertically driven to pass through the opened area of the body 21, so that a touch input can be provided to the touch screen panel 10.

The body 21 may have a length and thickness similar to those of, for example, a user's finger, and the inside of the body 21 may have a cavity suitable for accommodating the guide member 22, the plurality of conductive touch pins 23, and the like. For example, the body 21 may have a cylindrical shape. The shape of the body 21 may be variously modified and designed according to its usage or desired specification. The body 21 may be configured with a plurality of parts. Screw threads or flange structures may be at portions where the parts are fastened to each other so that the assembling and disassembling between the parts can be easily performed.

The guide member 22 is provided at the one opened end portion of the body 21. The guide member 22 may have a plurality of openings through which the conductor bundle configured with the conductive touch pins 23 can pass. For example, the guide member 22 may be positioned so that its plane toward the touch screen panel 10 has a mesh structure as shown in FIGS. 4 and 5. The conductive bundle including the plurality of conductive touch pins 23 may be vertically driven through the openings in the mesh structure. The guide member 22 may be installed in an entrance through which the plurality of conductive touch pins 23 pass, to guide the vertical driving (vertical movement) of each conductive touch pin 23. The guide member 22 may have, for example, a plurality of tubes having a predetermined height as shown in the sectional structure of FIG. 3. The guide member 22 may be in the shape of a net installed in the entrance through which the plurality of conductive touch pins 23 pass.

The guide member 22 may include, for example, a conductive material. The guide member 22 may be coupled to a ground portion, or the like, so that a touch input to an extent similar to that of a finger can be provided to the touch screen panel 10. However, the guide member 22 does not necessarily include a conductive material. The guide member 22 may include a non-conductive material. The conductor bundle positioned to pass through the openings of the guide member 22 may have the plurality of conductive touch pins 23 vertically driven by passing through the respective openings of the guide member 22. Each conductive touch pin 23 may include a fine conductor that can be independently vertically driven. For example, each conductive touch pin 23 may be implemented in the form of a conductive lead.

The plurality of conductive touch pins 23 may be independently vertically driven by respectively passing through different openings of the guide member 22 as shown in FIG. 5. That is, the conductive touch pins 23 may be vertically driven to different extents. For example, the conductive touch pins 23 may be vertically driven corresponding to the shape of a contact surface with the touch screen panel 10. The driving unit 24 may be designed to vertically drive the conductor bundle configured with the plurality of conductive touch pins 23. For example, the driving unit 24 according to this embodiment may include an elastic member 25 accommodated inside the body 21 to be coupled to the plurality of conductive touch pins 23, and a control device 26 configured to control the pressure inside the elastic member 25.

Although it has been described in this embodiment that all the conductive touch pins 23 are vertically driven by being coupled to one elastic member 25, not all touch pins need be so provided or arranged. For example, the driving unit 24 may be designed so that a plurality of elastic members may be provided inside the body 21, and the conductive touch pins 23 may be vertically driven by being coupled to any one of the plurality of elastic members.

The elastic member 25 may include some or all mechanical components having elasticity. For example, the elastic member 25 may be provided so that the elasticity of the elastic member 25 may be maintained by air or fluid filled in the elastic member 25. As the shape or internal pressure of the elastic member 25 is changed while being controlled by the control device 26, the conductive touch pins 23 coupled to the elastic member 25 may be vertically driven. The control device 26 may be used to control the shape or internal pressure of the elastic member 25. For example, the control device 26 may be configured with a hydraulic oil pump 26a that controls the pressure inside the elastic member 25.

The diaphragm 27 may be located at the one opened end portion of the body 21 to control the opened area, i.e., the contact area (CA) of the body 21. For example, the diaphragm 27 may be configured with several sheets of sectors that cover the outside of the contact area CA. As the sectors are gathered and scattered, the contact area CA can be opened/closed. The diaphragm control unit 28 may be a device for controlling the diaphragm 27. In an embodiment, the diaphragm control unit 28 may be designed so that as a user manually rotates a handle provided at an end portion of the diaphragm control unit 28, the degree of opening/closing of the diaphragm 27 can be controlled. The diaphragm control unit 28 may be designed so that the degree of opening/closing of the diaphragm 27 can be automatically controlled in response to a control signal supplied from outside the device.

The touch input device 20 can be usefully applied to, for example, a touch testing device used in the test or estimation of the touch screen panel 10. For example, in the touch input device 20, the plurality of conductive touch pins 23, may be independently vertically driven, and may apply a touch input while being contacted with the touch screen panel 10. A stable touch input can be provided to the curved touch screen panel 10. When the touch input device 20 is contacted with the curved touch screen panel 10 as shown in FIG. 6, for example, the contact area between the touch input device 20 and the touch screen panel 10 can be increased by controlling the degree of vertical driving of the conductive touch pins 23, corresponding to the curved shape of the touch screen panel in the contact area between the touch input device 20 and the touch screen panel 10. It is possible to stably provide a touch input to the touch screen panel having various shaped surfaces through the conductive touch pins 23 independently vertically driven along the surface shape of the touch screen panel 10, without replacing the conductive rod, by selecting the conductive rod suitable for the surface shape of the touch screen panel 10.

Figure 7:
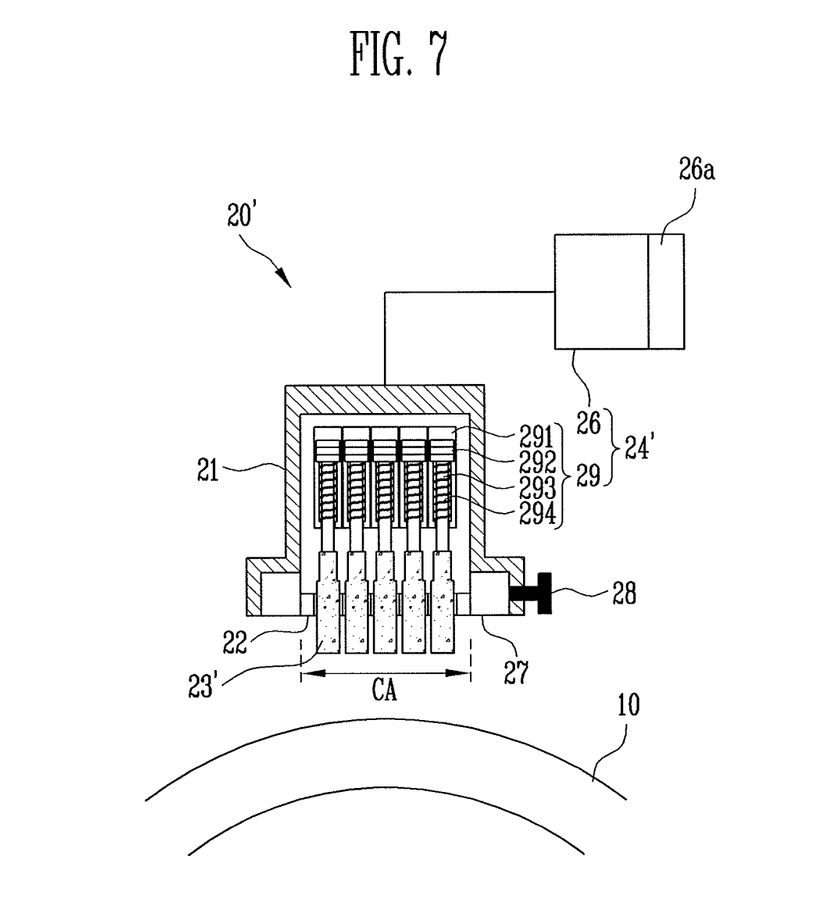
FIG. 7 schematically illustrates a configuration view of a touch input device.

FIG. 7 schematically illustrates a configuration view of a touch input device. In FIG. 7, components identical or similar to those of FIG. 3 are designated by like reference numerals. Referring to FIG. 7, in the touch input device 20' according to this embodiment, a driving unit 24' for vertically driving conductive touch pins 23' may include a plurality of piston structures 29, and the control device 26 may be configured to control the piston structures 29 to be vertically driven. Each piston structure 29 may be accommodated inside the body 21 to be coupled to one or more conductive touch pins 23'. Each piston structure 29 may vertically drive the conductive touch pin 23' coupled thereto. Each piston structure 29 may be configured to include a cylinder 291, which may be implemented as a single or double acting cylinder, a piston head 292 vertically moved in the cylinder 291, a piston rod 293 coupled to the piston head 292, and a spring 294 wound around the piston rod 293. Each piston structure 29 may be vertically driven while being controlled by the control device 29.

Each conductive touch pin 23' may be coupled to one end of the piston structure 29, for example, one end of the piston rod 293, to be vertically moved in conjunction with the vertical driving of the piston structure 29. Each conductive touch pin 23' may be designed to have a shape in which its contact area with the touch screen panel 10 may be maximized. For example, each conductive touch pin 23' may have a first end coupled to the piston structure 29, and a second end input and/or output by passing through the guide member 22. The sectional area of the second end in the contact area CA may be wider than that of the first end coupled to the piston structure 29.

The control device 26 may include all mechanical components that can induce the vertical driving of the piston structure 29. For example, the control device 26 may be configured with a pressing device for pressing the rear side of the piston structure 29, on which the piston head 292 may be located, or may be configured with a hydraulic oil pump 26a for applying a predetermined pressure to the front side and/or the rear side of the piston structure 29. For example, the control device 26 may be configured with or operatively associated with a hydraulic oil pump 26a and the cylinder 291 may be configured with a single acting cylinder. If pressure is applied to the rear side (top side) of the single acting cylinder, for example, the conductive touch pins 23' may be contacted with the touch screen panel 10 as the piston head 292 and the piston rod 293 are moved forward a lower portion of the touch screen panel 10. If the pressure is removed by the hydraulic pump 26a, for example, the touch input can be removed as the piston head 292 and the piston rod 293 are moved backward an upper portion of the touch screen panel 10 by the elasticity of the spring 294.

The control device 26 may also be configured with or operatively associated with a hydraulic oil pump 26a and the cylinder 291 may include a double acting cylinder. If pressure is applied to the rear side (top side) of the double acting cylinder through the hydraulic oil pump 26a, the conductive touch pins 23' may be contacted with the touch screen panel 10 as the piston head 292 and the piston rod 293 are moved forward toward a lower portion of the touch screen panel 10. If pressure is applied to the front side (bottom side) of the double acting cylinder through the hydraulic oil pump 26a, for example, the touch input may be removed as the piston head 292 and the piston rod 293 are moved backward toward an upper portion of the touch screen panel 10. The spring 294 need not be provided. The plurality of conductive touch pins 23' may be vertically driven using the piston structure 29. In this case, one piston structure 29 may be designed to vertically drive only one conductive touch pin 23', or may be designed to vertically drive two or more adjacent conductive touch pins 23'.

The touch input device 20 or 20' may be configured to apply a touch input to the touch screen panel 10, using the conductor bundle including the plurality of conductive touch pins 23 or 23' configured to be vertically driven to different extents. As the degree of vertical driving of each conductive touch pin 23 or 23' may be controlled corresponding to the shape of a contact surface of the touch input device 20 or 20' with the touch screen panel 10, it is possible to increase the contact area between the touch screen panel 10 and the touch input device 20 or 20'. Thus, the touch input device 20 or 20' can be provided, which enables a stable touch input to be performed on the touch screen panel 10 having the curved surface. Further, the touch input device 20 or 20' may further include a diaphragm 27 provided at one side toward the touch screen panel 10 to adjust the opened area of the body 21, and a diaphragm control unit 29 configured to control the diaphragm 27. The contact area between the touch screen panel 10 and the touch input device 20 or 20' can be easily adjusted by controlling the operational range of the conductor bundle.

By way of summation and review, when characteristics of a touch screen panel are tested, a touch input device in place of a user's hand may be used to provide an exact touch input to the touch screen panel. For example, when characteristics of an electrostatic capacitive touch screen panel are tested, a conductive rod may be used, which causes a change in capacitance when being contacted with the touch screen panel.

A conductive rod may be implemented as, for example, a cylindrical conductive rod made of a metal material. The contact surface of the conductive rod contacted with the touch screen panel may be a plane. When the conductive rod is contacted with a curved surface area of a flexible touch screen panel or a touch screen panel having a curved surface, for example, it may be difficult to sufficiently secure the contact area between the conductive rod and the touch screen panel. A touch input need not be sensed or may be unstably provided. This may cause the lowering of the test reliability of the touch screen panel.

The touch input device described herein may be configured to apply a touch input to the touch screen panel, using the conductor bundle including the plurality of conductive touch pins capable of being vertically driven to different extents. Embodiments provide a touch input device that can provide a stable touch input to a touch screen panel having a curved surface. The contact area between the touch screen panel and the touch input device can be increased by controlling the degree of vertical driving of each conductive touch pin, corresponding to the shape of the contact surface of the touch screen panel. Thus, it is possible to stably provide a touch input to the touch screen panel having the curved surface.

A touch input device may further include the diaphragm provided at one side toward the touch screen panel to adjust the opened area of the body, and the diaphragm control unit configured to control the diaphragm. Accordingly, the contact area between the touch screen panel and the touch input device can be easily adjusted by controlling the operational range of the conductor bundle.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A touch input device, comprising:
a body having an open end at an open end portion of the body;
a mesh-shaped guide member at the open end portion, and having a plurality of openings defined by portions of the mesh-shaped guide member that cross other portions of the mesh-shaped guide member;
a conductor bundle including a plurality of conductive touch pins vertically drivable through the plurality of openings; and
a driving unit that vertically drives the conductor bundle.

2. The touch input device as claimed in claim 1, wherein each of the plurality of conductive touch pins are to be independently vertically driven by passing through different openings of the plurality of openings.

3. The touch input device as claimed in claim 1, wherein the mesh-shaped guide member has a mesh-shaped plane, and the guide member includes a plurality of tubes that guides the vertical driving of each conductive touch pin.

4. The touch input device as claimed in claim 1, wherein the driving unit including an elastic member inside the body, couplable to the plurality of conductive touch pins, and a control device that controls a pressure inside the elastic member.

5. The touch input device as claimed in claim 4, wherein the control device includes a hydraulic oil pump.

6. The touch input device as claimed in claim 1, wherein the driving unit includes a plurality of piston structures inside the body, each piston structure being coupled to at least one of the conductive touch pins, and a control device that controls the vertical driving of each piston structure.

7. The touch input device as claimed in claim 6, wherein the plurality of conductive touch pins each includes a first end coupled to respective piston structures and a second end passing through the mesh-shaped guide member, the second end having a sectional area wider than that of the first end.

8. The touch input device as claimed in claim 6, wherein the control device includes a hydraulic oil pump.

9. The touch input device as claimed in claim 1, further comprising:
a diaphragm at the open end portion of the body that adjusts an open area of the body; and
a diaphragm control unit that controls the diaphragm.

10. The touch input device as claimed in claim 1, wherein the mesh-shaped guide member includes a conductive material electrically coupled to a ground portion.

11. A touch input device, comprising:
a body having an open end at an open end portion of the body;
a mesh-shaped guide member at the open end portion, and having a plurality of openings;
a conductor bundle including a plurality of conductive touch pins vertically drivable through the plurality of openings; and
a driving unit that vertically drives the conductor bundle,
wherein each of the plurality of conductive touch pins are to be independently vertically driven to different extents through different openings of the plurality of openings, such that the conductive touch pins provide touch input on a curved touch screen panel.

12. A touch input device, comprising:
a body having an open end at an open end portion of the body;
a mesh-shaped guide member at the open end portion, and having a plurality of openings;
a conductor bundle including a plurality of conductive touch pins vertically drivable through the plurality of openings; and
a driving unit that vertically drives the conductor bundle,
wherein each of the plurality of conductive touch pins has a respective corresponding opening of the plurality of openings of the mesh-shaped guide member.

* * * * *